(12) United States Patent
Murtuza et al.

(10) Patent No.: US 11,211,369 B2
(45) Date of Patent: Dec. 28, 2021

(54) SERVICE MODULE FOR SIP DEVICES

(71) Applicant: OCTAVO SYSTEMS LLC, Sugar Land, TX (US)

(72) Inventors: Masood Murtuza, Sugar Land, TX (US); Gene Alan Frantz, Sugar Land, TX (US)

(73) Assignee: OCTAVO SYSTEMS LLC, Sugar Land, TX (US)

(*) Notice: Subject to any disclaimer, the term of this patent is extended or adjusted under 35 U.S.C. 154(b) by 10 days.

(21) Appl. No.: 16/293,130

(22) Filed: Mar. 5, 2019

(65) Prior Publication Data
US 2019/0273073 A1 Sep. 5, 2019

Related U.S. Application Data

(66) Substitute for application No. 62/638,564, filed on Mar. 5, 2018.

(51) Int. Cl.
| | |
|---|---|
| *H01L 25/16* | (2006.01) |
| *H01L 23/498* | (2006.01) |
| *H01L 23/538* | (2006.01) |
| *H01L 23/31* | (2006.01) |
| *G01R 31/28* | (2006.01) |
| *H01L 25/00* | (2006.01) |
| *G06F 30/34* | (2020.01) |

(52) U.S. Cl.
CPC ........ *H01L 25/162* (2013.01); *G01R 31/2886* (2013.01); *G01R 31/2887* (2013.01); *G01R 31/2896* (2013.01); *G06F 30/34* (2020.01); *H01L 23/3128* (2013.01); *H01L 23/49816* (2013.01); *H01L 23/49822* (2013.01); *H01L 23/5383* (2013.01); *H01L 23/5385* (2013.01); *H01L 23/5386* (2013.01); *H01L 23/5389* (2013.01); *H01L 25/50* (2013.01)

(58) Field of Classification Search
CPC ............ H01L 25/162; H01L 23/49816; H01L 23/5389; H01L 23/3128; H01L 23/5383; H01L 23/49822; H01L 2924/15311; H01L 2224/16225; H01L 25/105; H01L 22/14; G06F 30/34

See application file for complete search history.

(56) References Cited

U.S. PATENT DOCUMENTS

| | | | | |
|---|---|---|---|---|
| 6,376,769 | B1* | 4/2002 | Chung | B32B 7/12 174/524 |
| 2012/0032684 | A1* | 2/2012 | Siddiquie | G01R 31/70 324/538 |
| 2013/0242496 | A1* | 9/2013 | Ahmad | H05K 7/1092 361/679.31 |
| 2013/0330846 | A1* | 12/2013 | Tang | H01L 22/34 438/15 |
| 2017/0141087 | A1* | 5/2017 | Vincent | H01L 25/105 |
| 2019/0206779 | A1* | 7/2019 | Murtuza | H05K 1/111 |

* cited by examiner

*Primary Examiner* — Akm Zakaria
(74) *Attorney, Agent, or Firm* — Rothwell, Figg, Ernst & Manbeck, P.C.

(57) ABSTRACT

The present disclosure describes a service module for a System in a Package (SiP) device. This includes methods of manufacture, use, and testing relating to the same.

9 Claims, 18 Drawing Sheets

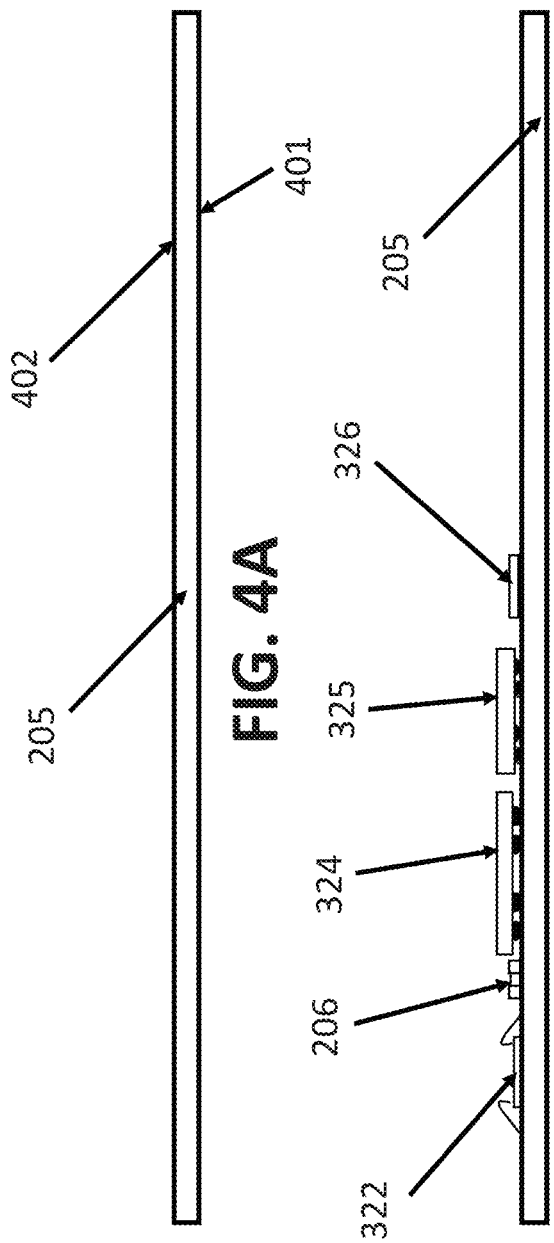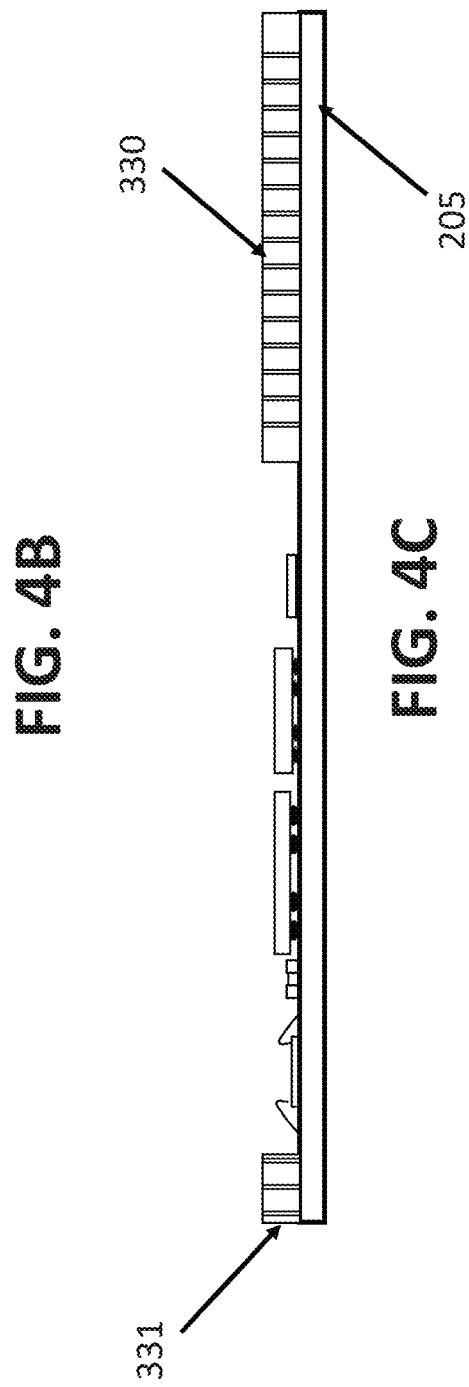

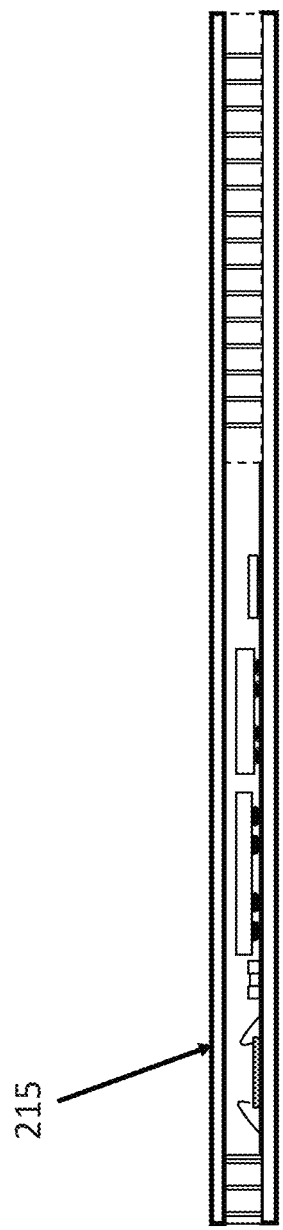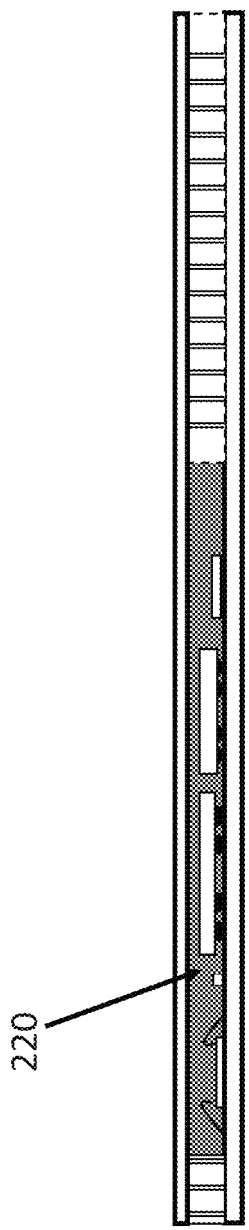

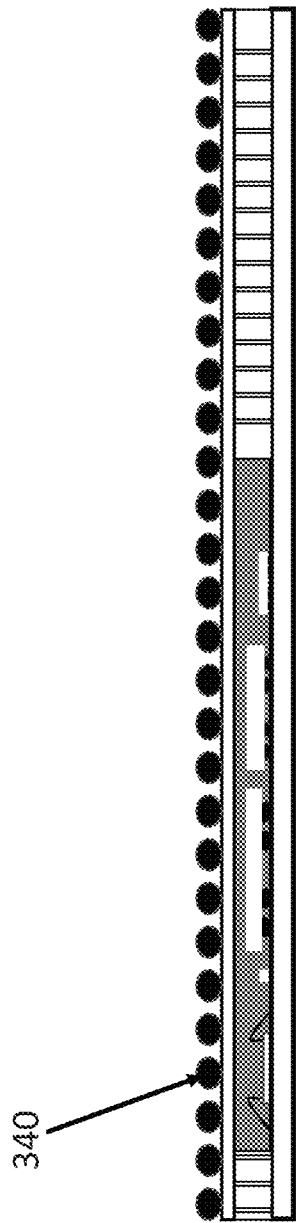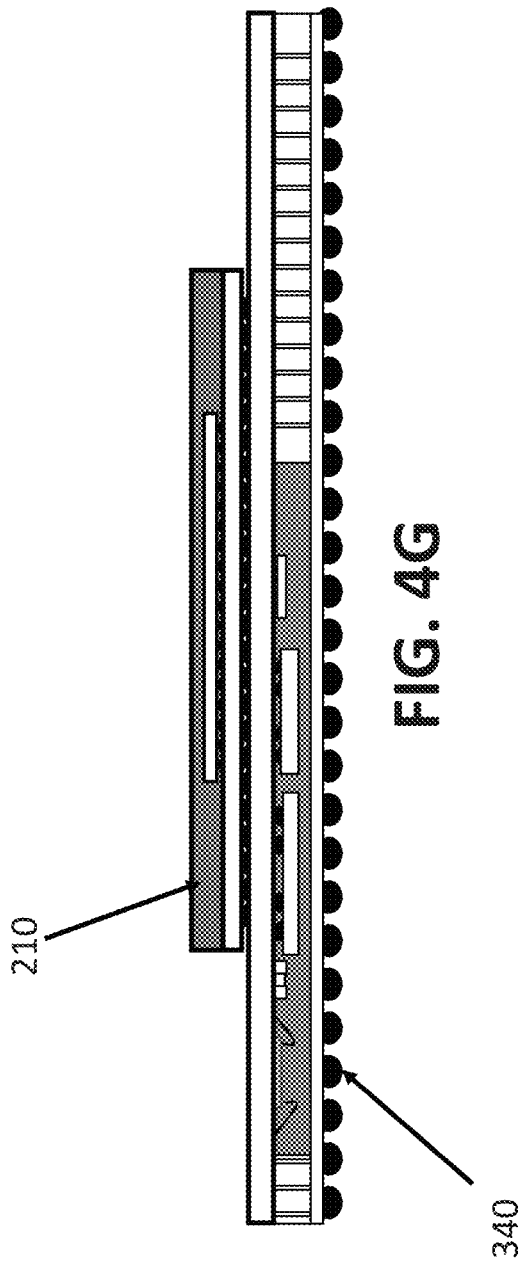

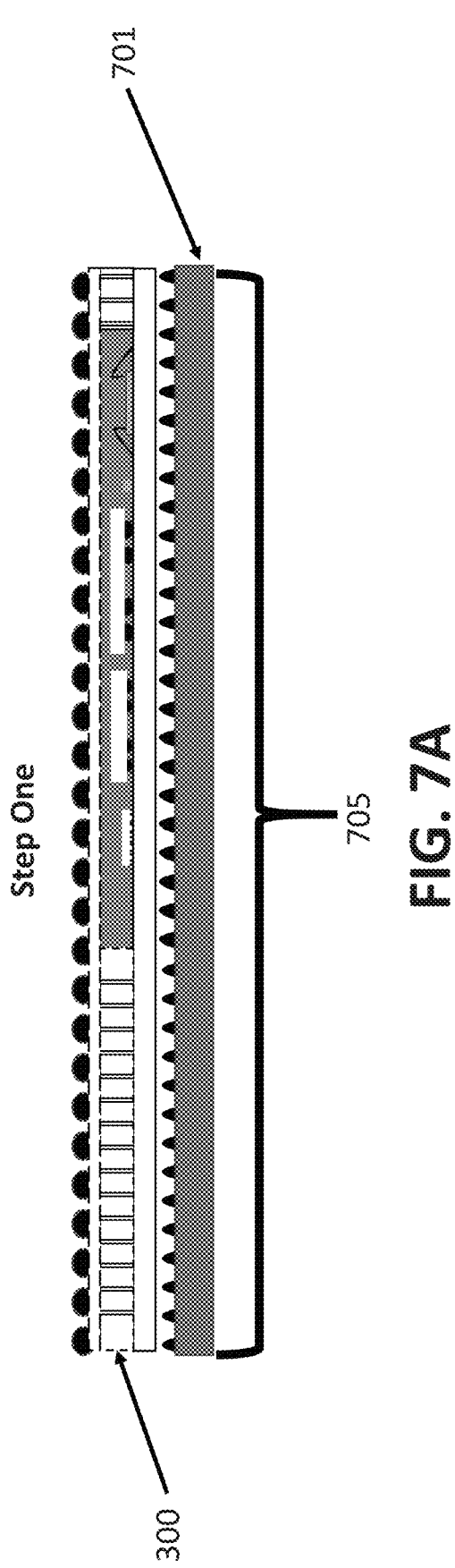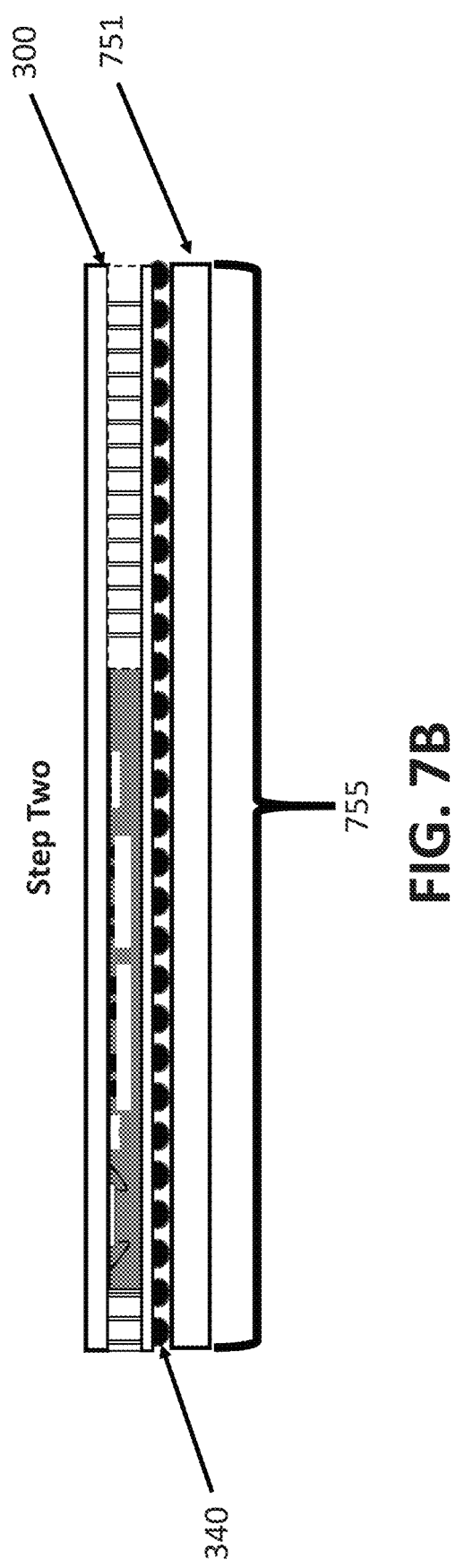

SERVICE MODULE FOR SIP DEVICES

CROSS REFERENCE TO RELATED APPLICATION

This application claims the benefit of U.S. Provisional Application No. 62/638,564, which was filed Mar. 5, 2018.

TECHNICAL FIELD

This disclosure relates to a service module for use in System in a Package (SIP) devices.

BACKGROUND

System-on-a-Chip ("SoC") refers to a device currently used in the semiconductor industry that incorporates different functional circuit blocks on a single monolithic block of silicon to form one system circuit. Systems in a Package ("SIP"s) are currently used in the semiconductor industry to assemble multiple integrated circuits, other devices and passive components in one package.

SUMMARY

SIPs enable integration of devices with diverse device fabrication technologies such as digital, analog, memories and other devices and components such as discrete circuits, devices, sensors, power management and other SIPs that are otherwise impossible or impractical to integrate into a single silicon circuit like an ASIC or SoC. The above discrete circuits and devices may include non-silicon based circuits, such as for example, but not limited to, organic, silicon-germanium (SiGe), or gallium-nitride (GAN). SIPs are also attractive because they allow miniaturization of microelectronic systems from a printed circuit board tens of square cm in size to typically a single package a few square cm or less. Another benefit of a SIP, and according to some embodiments, is that it can allow for the building of prototypes to test a system prior to further integration of some or all of the components into a single monolithic silicon circuit to produce a SoC.

Aspects of the present disclosure may allow for simplification of system design by using a service module as a basic building block on which a custom SIP may be built. The service module may be used to further miniaturize a SIP by having a basic SIP service module containing components needed for any SIP to operate and which may be re-used as a foundation for a family of SIP systems, and on which another SIP having desired unique system components may then be attached to create a desired SIP system. According to some embodiments, a service module could include additional processors, accelerators, analog or digital subsystems to increase the system capability or performance.

According to some embodiments, a service module for a SIP device is provided, which comprises: a first substrate with a plurality of active and passive components mounted on the surface and a plurality of conduits; a second substrate attached to one or more of said plurality of conduits; a molding compound/encapsulant in a space between said first and second substrates; one or more connectors (such as ball grid array balls, or bumps, or pins) on a non-molded surface of said second substrate for connecting to an external circuit; and one or more external connectors on the non-molded surface of said first substrate for connecting to an external component to be connected to and mounted on said connectors. The active and passive components may comprise, for instance, service components, such as memories, power management, communications, accelerators, and sensors, for example.

According to some embodiments, a SIP device is provided, which comprises: a first substrate on which there are mounted a plurality of active and passive components on the surface and a plurality of conduits; a second substrate attached to said plurality of surface mount conduits; mold compound filling in the spaces between the two substrates; a series of connectors on a non-molded surface of said second substrate for connecting to an external circuit; a series of external connectors on a non-molded surface of said first substrate for connecting to an external component to be connected to and mounted on said connectors; and a processor and at least one high speed memory mounted on a third substrate connected to and mounted on said series of external connectors According to some embodiments, a system is provided, which comprises: a base; a SIP service module, wherein a bottom surface of said SIP service module is mounted on a top surface of said base; and one or more processors, wherein said one or more processors are mounted on a top surface of said SIP service module. According to some embodiments, said base is a Printed Circuit Board (PCB) and at least one of said one or more processors is a microprocessor, controller, FPGA (Field Programmable Gate Array), or GPU (Graphics Processing Unit).

In some embodiments, a reduced footprint is achieved.

According to certain aspects, there is provided a System in a Package (SIP) service module for a SIP based system, comprising: a first substrate with a top surface and a bottom surface, wherein a first plurality of surface mount active devices, a first plurality of passive components, and a first plurality of surface mount conduits are mounted on the top surface of the first substrate; a second substrate with a top surface and a bottom surface mounted on and attached to said first plurality of surface mount conduits to create an enclosed space between the first and second substrates, wherein the top surface of the first substrate faces the bottom surface of the second substrate, and wherein the bottom surface of the first substrate and the top surface of the second substrate remain exposed; a first plurality of external connectors on the top surface of the second substrate for connecting to an external circuit; and a second plurality of external connectors on the bottom surface of the first substrate for connecting to an external device or component to be connected to and mounted on said second plurality of external connectors.

In some embodiments, the SIP service module further comprises a mold or encapsulant compound filling in said enclosed space between said first substrate and said second substrate.

In some embodiments, the SIP service module further comprises a second plurality of surface mount active devices and a second plurality of passive components operatively mounted on the bottom surface of the second substrate. In some embodiments, said first plurality of external connectors on the top surface of the second substrate comprise at least one or more of ball grid array balls, bumps, and pins.

In some embodiments, each substrate further comprises a plurality of layers with etched conductors and vias for operatively connecting said surface mount active devices, said passive components, and said external connectors. In some embodiments, said surface mount active devices and said passive components comprise service components. In some embodiments, said service components comprise at least one or more of DDR3, DDR4, LPDDR4 DRAMs, eMMC flash memory, QSPI flash memory, Ethernet PHY, power management IC (PMIC), LDO regulator, passive components, conduits for pass-through signals, TPM, wireless module, and special purpose components.

In some embodiments, the SIP service module further comprises a third substrate comprising a plurality of layers with etched conductors and vias for operatively connecting components mounted thereon, wherein the third substrate is operatively interconnected with said second plurality of external connectors on said first substrate. In some embodiments, said components mounted on said third substrate comprise at least one processor and high speed memory. In some embodiments, said third substrate comprises a SIP.

In another aspect, there is provided a System in a Package (SIP) comprising a first substrate comprising multiple layers with etched conductive paths and multiple vias associated therewith for making interconnections, and a first plurality of exterior conductive pads for additional external interconnections; a plurality of components mounted on a surface of said first substrate and operatively interconnected using said vias and said etched conductive paths, wherein at least one area on said surface of said first substrate comprises a plurality of surface mount conduits configured to operatively mount a second substrate; and said second substrate comprising a plurality of connective pads for making connections to said first substrate, multiple layers with etched conductive paths and multiple vias associated therewith for making interconnections, and a third plurality of exterior conductive pads for additional external interconnections, wherein each of said surface mount conduits contain conductive paths to make operative interconnections between said first substrate and said connective pads of said second substrate, and wherein said second substrate comprises a plurality of operatively interconnected components which together with said plurality of components mounted on said first substrate operates as a service module for additional devices and components operatively connected to said exterior conductive pads.

In another aspect, there is provided a system using at least one SIP, the system comprising a system substrate; a SIP service module comprising two interconnected substrates containing a plurality of active and passive components, a plurality of exterior external connectors for at least one external device, and a plurality of external connectors operatively attached to said system substrate; and a SIP device comprising at least one processor and high speed memory operatively connected to said plurality of exterior external connectors of said SIP service module.

In some embodiments, said at least one processor comprises at least one of a microprocessor, controller, Field Programmable Gate Array (FPGA), and Graphics Processing Unit (GPU). In some embodiments, said SIP device comprises one of a family of SIP devices having the same arrangement of external connectors as said plurality of exterior external connectors of said SIP service module for interconnection with said SIP service module and each device of said family has a different functionality.

In some embodiments, there is provided a method for testing a SIP service module using an Automated Test Equipment (ATE), comprising: operatively placing a SIP service module on a test board located on said ATE; and performing testing of said SIP service module using external connectors of said SIP service module used for attaching said SIP service module to a system substrate.

In some embodiments, the method further comprises using a proxy test head interconnected with said ATE and connected to external connectors of said SIP service module used for attaching said SIP service module to a SIP device; and performing testing of said SIP service module using external connectors of said SIP service module used for attaching said SIP service module to the system substrate, and said proxy test head for said SIP device.

In some embodiments, the method further comprises placing said SIP device on said load board and operatively connecting said SIP device to said ATE; and performing testing of said SIP service module using external connectors of said SIP service module used for attaching said SIP service module to the system substrate, and said proxy test head for said SIP device.

In some embodiments, the method further comprises operatively placing the SIP service module on the test board located on said ATE in an inverted position from said first testing; and performing a second testing of said SIP service module using external connectors of said SIP service module used for attaching said SIP service module to the system substrate.

In some embodiments, the SIP service module comprises a first substrate and a second substrate, wherein said first substrate comprises a first plurality of external connectors on an exposed surface of said first substrate for connecting to an external circuit, and wherein said second substrate comprises a second plurality of external connectors on an exposed surface of said second substrate for connecting to an external device to be connected to and mounted on said second plurality of external connectors, and wherein the arrangement of said external connectors are mirror images of each other.

In another aspect, there is provided a method for designing a system using SIPs, the method comprising designing a family of SIP devices comprising a common arrangement of external connectors for interconnecting with other components and devices, wherein each SIP device of said family has a unique and different functionality; and designing a single SIP service module operatively connectable to each of said family of SIP devices to create a family of different systems with functionality related to the functionality of each of said family of SIP devices connected to said single SIP service module.

In some embodiments, the SIP service module comprises a first substrate with a first surface and a second surface, wherein a first plurality of surface mount active devices, a first plurality of passive components, and a first plurality of surface mount conduits are mounted on the top surface of the first substrate; a second substrate with a top surface and a bottom surface mounted on and attached to said first plurality of surface mount conduits to create an enclosed space between the first and second substrates, wherein the top surface of the first the first substrate faces the bottom surface of the second substrate, and wherein the bottom surface of the first substrate and the top surface of the second substrate remain exposed; a first plurality of external connectors the top surface of the second substrate for connecting to an external circuit; and a second plurality of external connectors on the bottom surface of the first substrate for connecting to an external device or component to be connected to and mounted on said second plurality of external connectors.

According to some embodiments, a process of assembling systems is provided. The process may begin by attaching a first module (e.g., SIP) to the top surface of a first SIP service module to form a first system having first characteristics. The process may further include attaching a second module (e.g., SIP) to the top surface of a second SIP service module to form a second system having second characteristics, wherein said first and second SIP service modules are identical.

These and other features of the disclosure will become apparent to those skilled in the art from the following detailed description of the disclosure, taken together with the accompanying drawings.

BRIEF DESCRIPTION OF THE DRAWINGS

Certain embodiments of the disclosure will be described with reference to the accompanying drawings. However, the accompanying drawings illustrate only certain aspects or implementations of the disclosure by way of example and are not meant to limit the scope of the claims.

FIGS. 4A-4G depict side views of steps to build a service module SIP according to some embodiments.

FIGS. 7A and 7B depict a block diagram for testing the service module according to some embodiments.

DETAILED DESCRIPTION

Figure 1A:
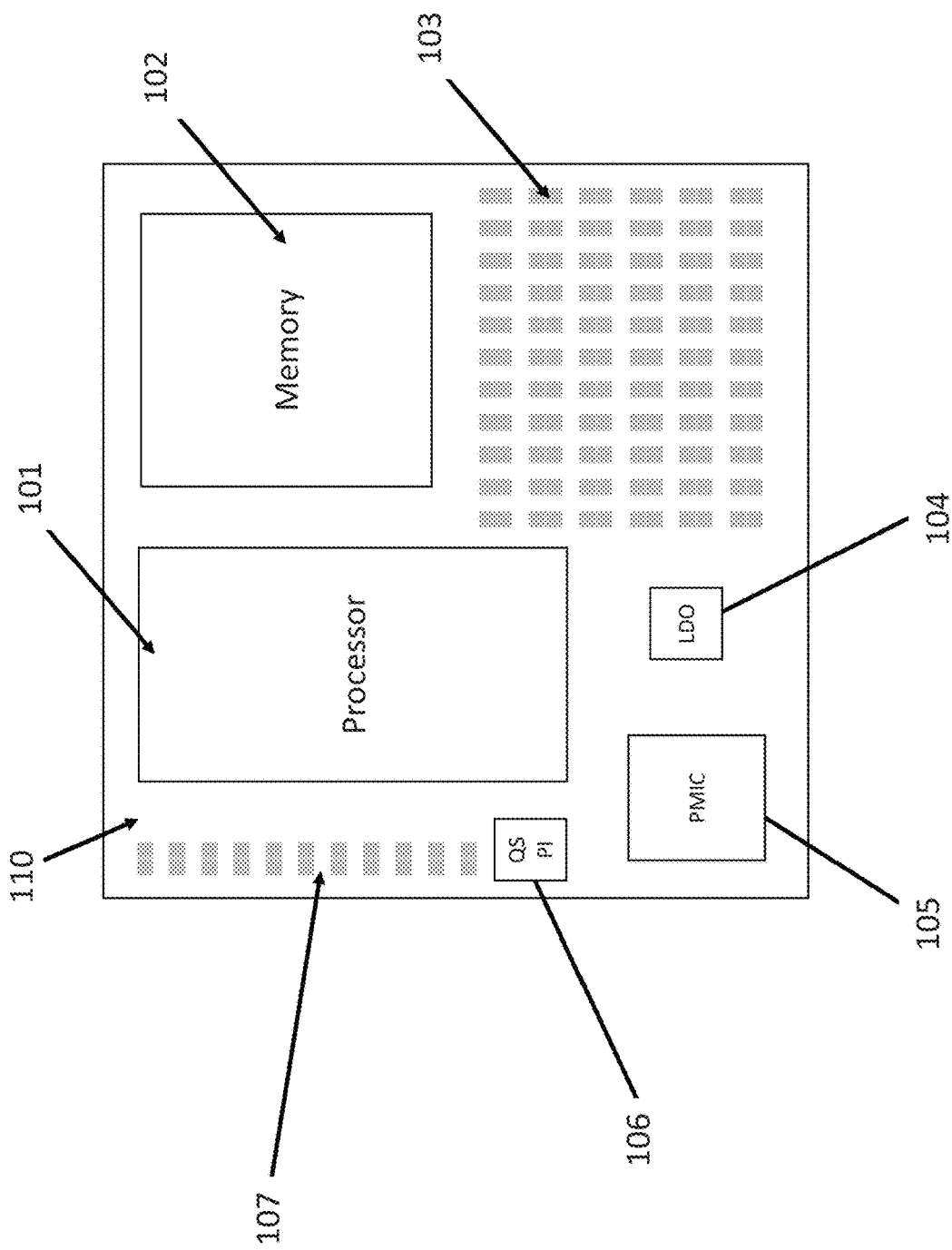
FIGS. 1A and 1B depict a top and side view of a SIP according to some embodiments.

Many general-purpose processors and programmable logic devices offer an exceptionally flexible solution that may be customized through programming for a desired end system use. In most systems, these processors and devices need a set of support components to build a complete solution, such as DDR and FLASH memories, power supplies, PHY interfaces, wireless modules, security devices, and in some instances, hundreds of passive components. These support components are herein called "service components." Today's systems are typically designed starting with discrete components, which are used to implement a desired circuit, one system at a time. This process is typically unique for each design, which takes design resources, extends the development timeline, and increases development risks.

Thus, there is a need for a SIP module, which can be referred to as a "SIP service module," that integrates at least a substantial portion or all of the "service components" named above, which when mated with appropriate standalone microprocessors and programmable logic devices, avoids the need for custom design for the overall system by using these "service components" as a starting point for the system design. In some embodiments, a re-configurable analog processing array RAPA and/or accelerator(s) may be part of the service module. For instance, it may comprise one or more RAPAs and/or programmable digital core arrays (PDCAs) as set forth in PCT/US2019/019255 ("Mixed Signal Computer"), filed Feb. 22, 2019, which claims priority to U.S. provisional application No. 62/634,704 filed on Feb. 23, 2018, the disclosures of which are incorporated herein by reference in their entirety.

According to some embodiments, a SIP service module is provided, and in some instances, examples of various ways in which designs may be created using it are provided.

According to some embodiments, processes to manufacture and test a SIP service module are provided.

According to some embodiments, one or more "minimal viable SIP service modules" having the potential for added customizations for specific purposes are provided.

According to some embodiments, a SIP service module may be combined with another SIP and used to cater to special applications, such as for example, but not limited to, hand-held devices requiring additional miniaturization, or harsh environment requiring additional ruggedness. For instance, a SIP service module as disclosed herein may be used in one or more arrangement as set forth in PCT/US2016/050157 ("Improved System Using System In Package Components"), filed Sep. 2, 2016, which claims the priority to U.S. provisional Application No. 62/214,640 filed on Sep. 4, 2015, the disclosures of which are incorporated herein by reference in their entirety.

In certain aspects, from a user perspective, some goals of this SIP service module are to: (1) reduce development times, (2) reduce development risks, and (3) lower overall system costs relating to development, debug, and deployment. Additional benefits may also be a result of the use of a service module that are not described herein.

Examples of service components which may be integrated in a SIP service module, according to some embodiments, are DRAMs (e.g. DDR3, DDR4 or LPDDR4), embedded Multi-Media Controller (eMMC) flash memory, quad serial peripheral interface (QSPI) flash memory, Ethernet PHY, power management IC (PMIC) and low dropout (LDO) power supply regulator, passive components, conduits for pass-through signals, trusted platform module (TPM), wireless module, and other special purpose components.

Figure 1B:
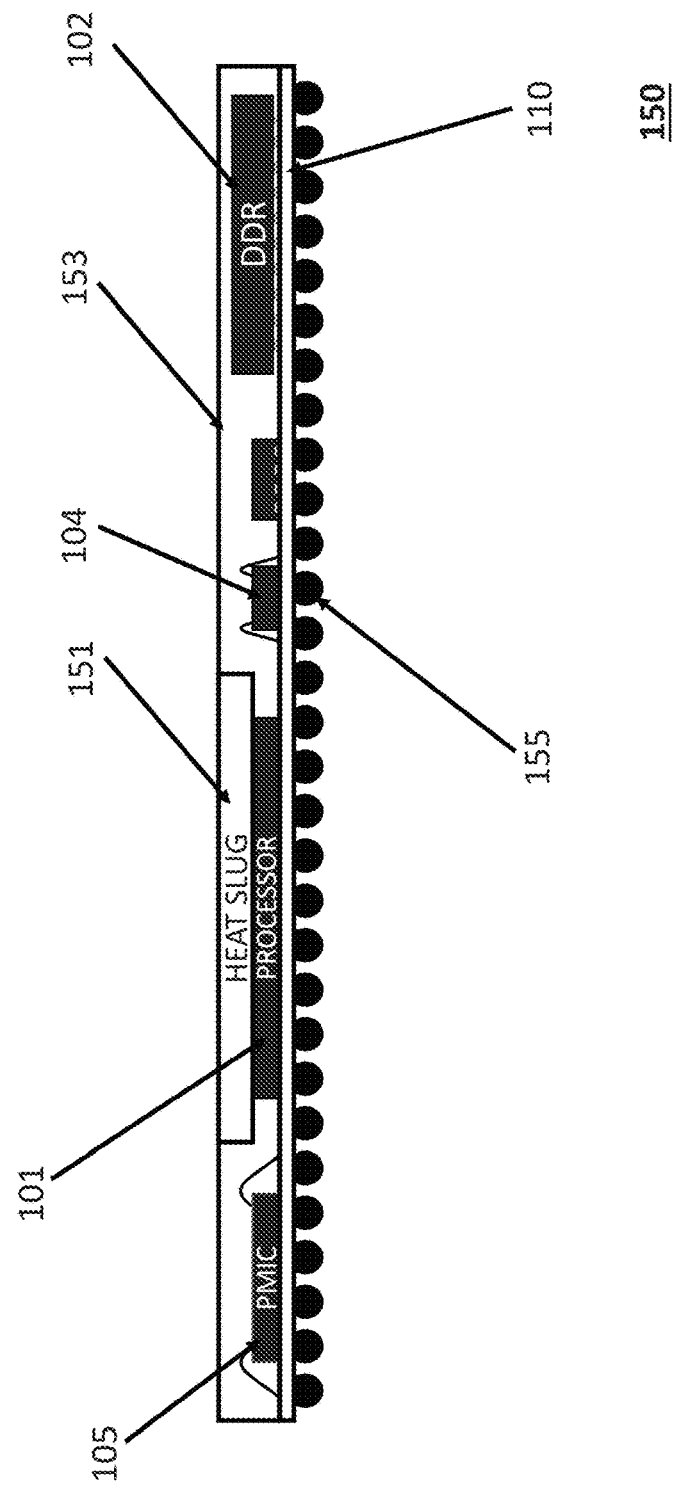

FIGS. 1A and 1B depict a top view 100 and side view 150, respectively, of a microprocessor-based SIP device 101.

According to some embodiments, a high performance SIP 100, as shown in FIG. 1A, comprises a high performance processor 101 that is attached to a substrate 110 and one or more associated memory device(s) 102. The processor (and/or logic unit) 101 and memory 102 are electrically interconnected with circuitry on and internal to the substrate 110. The processor 101 may be, for instance, one or more of microprocessor or FPGA (Field Programmable Gate Array) or GPU (Graphics Processing Unit). As depicted in FIG. 1A, the high performance module 100 may also comprise other components, for example, but not limited to, a power management component 105, a voltage control device 104, a QSPI memory component 106, a plurality of passive devices 103, and other I/O components or pads 107. According to some embodiments, these devices may be interconnected by means of the substrate 110. In some instances, the substrate contains within it a number of Cu layers which are previously etched to enable the required interconnection (net-list and schematic diagram).

FIG. 1B depicts a side view 150 of the SIP 100. This view shows the various components 101, 102 105, 104 attached to the substrate 110. In addition to the attached components a heat sink 151 (also referred to as a heat slug) may be attached to the processor. In some embodiments, the SIP 100 is encapsulated 153 and interconnection balls 155 in the form of a ball grid array (BGA) are attached to the bottom side of the substrate 110. In this example, the substrate 110 contains within it a plurality of conductive layers to make the required operative interconnections for the various components of the SIP 100. According to some embodiments, the heat slug 151 may be made of Cu or other thermally conductive material. In some embodiments, the heat slug 151 is attached on the processor 101 such that when the whole group of components are assembled together and encapsulated, the heat slug 151 is exposed to the surface of BGA package.

Although FIGS. 1A and 1B depict and describe a processor or microprocessor, other high speed components, that may or may not comprise a processor, may be employed in these configurations. Such high speed components may be digital logic devices, analog circuits or mixed signal devices. In addition, high speed interconnections between a high speed memory device and other high speed components made through the substrate using a variety of bus bit widths.

Figure 2:
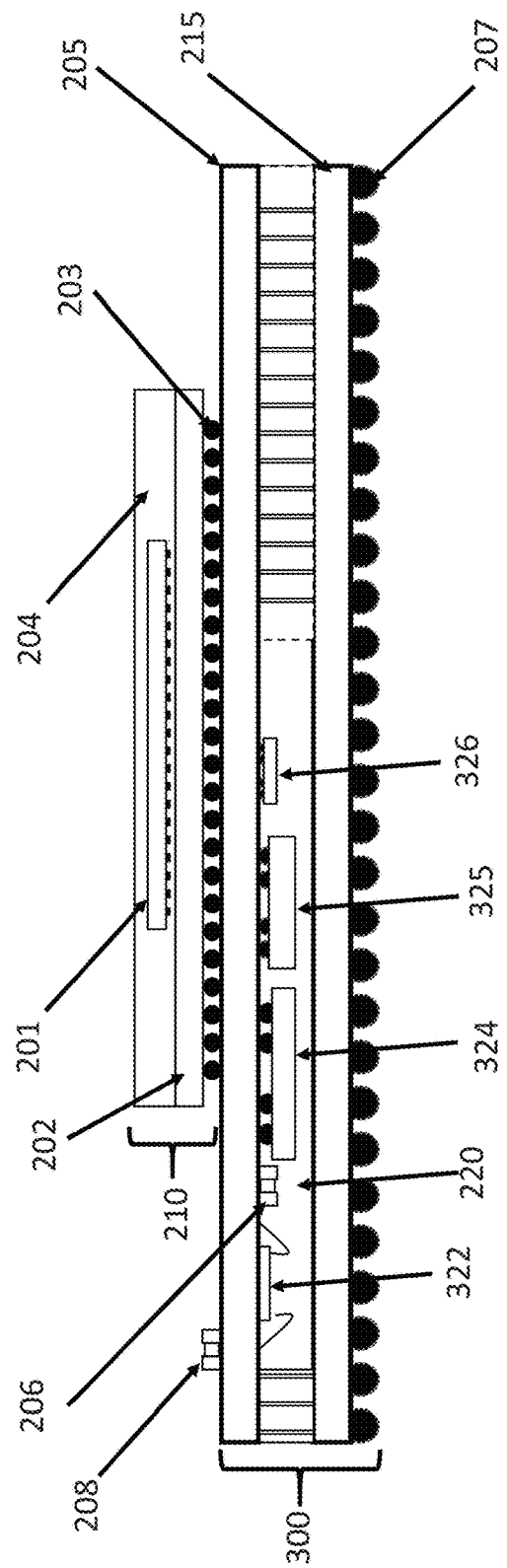
FIG. 2 depicts a side view of a service module SIP and a custom SIP according to some embodiments.

FIG. 2 depicts a side view of a service module 300 according to some embodiments, and how it may be interconnected with a unique custom SIP 210, like that depicted in FIG. 1. The custom SIP 210 comprises a processor 201 mounted on a SIP substrate 202, a ball grid array 203 attached to the substrate, and encapsulant 204. In some embodiments, the processor 201 may be directly attached to the service module and the SIP 210 may not comprise any encapsulant. The ball grid array 203 is used to make connections with landing pads on the surface of a first substrate 205 of the service module 300. In this configuration the processor 201 and any other components of the custom SIP may be connected to and mounted on a surface of the first substrate 205 of the service module 300. Within the service module 300 various service components are mounted on and operatively connected to a second substrate 215, and signals from the first substrate 205 may be passed through non-conductive material using vias or other connectors (e.g., electrical conductors or wires or connectors) to a surface of the second substrate 215, which are then connected to the balls 207 on the second substrate 215. According to some embodiments, FIG. 2 shows a cross sectional view of a System-in-Package with an assembly format that has one or more components stacked on top of each other, sometimes referred to as 2.5D assembly. In certain aspects, it comprises two main elements—one is a pre-packaged processor unit (210) comprising a microprocessor chip (201), a substrate (202) and connecting solder balls (203). A base unit which is an assemblage of (300) of commonly used components (105, 102, and 104) that can be used as a group to service the microprocessor unit (210) is provided. In addition to active components, this group may contain a conduit 330, 331 to transfer signals and power supply from the top substrate 205 of the service module to the bottom substrate 215. This configuration allows assembly of different microprocessors, such as those having a common functional foot print.

Figure 3:
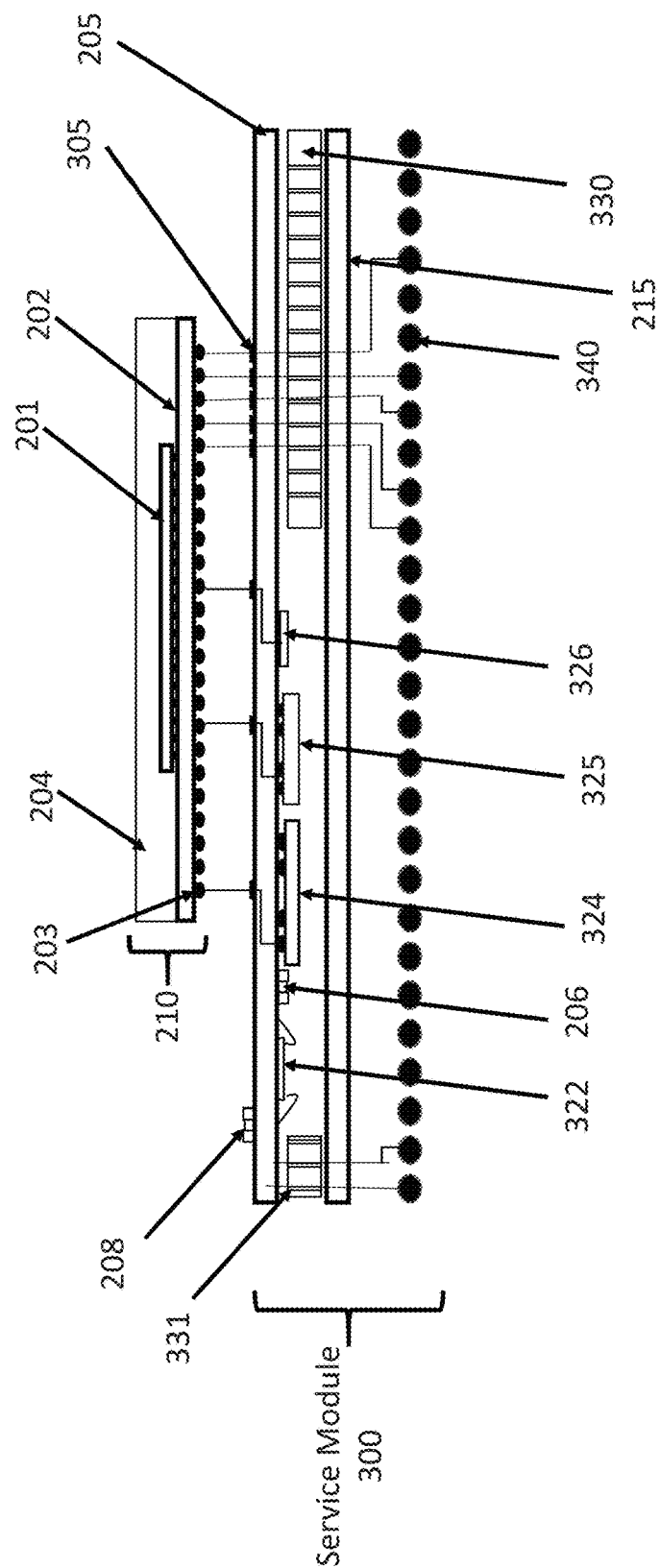
FIG. 3 depicts an exploded side view of the SIP service module and a custom SIP module according to some embodiments.

FIG. 3 provides further details regarding a SIP service module according to some embodiments. Referring now to FIG. 3, there may be seen an exploded side view of components of the SIP service module 300 and a custom SIP module 210. As may be seen from the example of FIG. 3, the basic elements of a system with a service module may be: a processor 201 and substrate 202 with external connections 203 (in the embodiment shown in FIG. 3 a ball grid array is shown, but other connection methods may be used, such as, but not limited to bumps, pins, etc. in alternative embodiments) as an example for a custom SIP module. According to embodiments, the service module 300 depicts a first substrate 205 and a second substrate 215. Attached to the first substrate 205 are landing pads 305 and optionally one or more passives 208. On the opposite side of the first substrate 205 components 322 (also referred to as 105 in FIGS. 1A-1B), 324 (also referred to as 102 in FIGS. 1A-1B), 325 (also referred to as 102 in FIGS. 1A-1B), 326 (also referred to as 106 in FIGS. 1A-1B), and passives 206 are mounted and operatively attached; these service components may be for example, but not limited to, memories 324, 325, 326, and a power management chip 322. Interconnection means 330, 331 which electrically connect the two substrates 205 and 215 are also attached to one side of the first substrate 205 with the surface mounted device ("SMD") 206. These service components (SMDs) may be packaged or may be bare die. Attached to one side of the second substrate 215 are the interconnection means 330, 331. Although not shown, additional components may be attached to a surface of the second substrate 215. External connection means 340, in this depiction a ball grid array, are mounted to a surface of the second substrate 215 (depicted in FIG. 3 as the lower, external surface of the second substrate 215).

According to some embodiments, the BGA balls 340 serve as interconnects for use with one or more external circuits or systems. For ease of depiction purposes, no mold compound is depicted in FIG. 3, but it is depicted in FIG. 2 (220). It may also be seen that the custom SIP attaches to and interconnects with external connectors 305 on the top-side surface of the first substrate and may directly or indirectly interconnect via the input/output interfaces 330, 331, with the service module BGA balls 340 for appropriate connections to external circuits or systems. The non-bonded surface of the first substrate 205 may also comprise connectors for and mountings of optional service components in areas not used for making connections with the custom SIP module 210.

The service components 322, 324, 325, 326 mounted in the service module 300 may be mounted as packaged parts, as shown, or as bare die, either wire bonded to the surface of the substrate 205 or be mounted as a flip chip device, for instance. Further these components may be, for example, but not limited to, memory devices, power management devices, communications devices, analog interface devices, either analog or digital accelerator devices, additional processors, or circuit and system test devices. Further, these devices may be mounted on either the surface of the first substrate 205 as shown in FIGS. 2, 3 and 4, or on the interior surface of the second substrate 215, or devices may be mounted on both the interior and exterior surface of substrates 205 and 215.

According to some embodiments, FIGS. 4A-4G depict side views of a process 400 to build a SIP service module and a supporting custom SIP module. Referring now to FIG. 4A, there is depicted a side view of a first service module substrate 205 with multiple conductive layers therein connected to external connectors located on first and second surfaces (e.g., the "top" surface 402 and "bottom" surface 401 of the substrate, with "top" and "bottom" surfaces as depicted in FIG. 4A). In some embodiments, the type of substrate 205 selected and the number of internal connection layers is dependent upon the number of and types of service components needed to make a specific service module. As depicted earlier in FIG. 3, there may a plurality of memory types included as part of the service module and that may help determine the type of substrate to be selected. According to some embodiments, a generic service module substrate may be created and selected, and only the service components needed for a particular system are actually installed and appropriately interconnected.

Referring now to FIG. 4B, the attachment of a plurality of support components 322, 206, 324, 325, and 326 to the substrate of FIG. 4A according to some embodiments is provided. As depicted earlier in FIG. 3, there may a plurality of components and elements mounted on and appropriately interconnected to the substrate of FIG. 4A as part of a service module. The number of and types of surface mount devices ("SMD"s) may help determine the type of substrate to be selected, and are mounted on a surface of the first substrate (e.g., SMD components). These service components (SMDs) may be packaged or may be bare die.

Referring now to FIG. 4C, the attachment of a plurality of surface mount conduit elements 330, 331 according to some embodiments is provided. As depicted earlier in FIG. 3, there may a plurality of input/output pass-through elements included as part of the service module that may help determine the type of substrate to be selected, and are mounted on a surface of the first substrate (e.g., SMD components). These input/output pass-through elements will connect to input/output pass-through vias in the first substrate.

Referring now to FIG. 4D, the attachment of a second substrate 215 is illustrated. The type of substrate selected may be dependent upon the number of and types of service components needed to make a specific service module.

Referring now to FIG. 4E, this figure illustrates the use of mold compound 220 to fill the space between the two substrates to create a partially packaged SIP service module according to some embodiments. For instance, the space between the two substrates is filled with an encapsulant (or mold compound) material to protect the various service devices attached to the substrates.

Referring now to FIG. 4F, the attachment of external connectors as a plurality of balls 340 to make up a ball grid array mounted on a surface of a service module according to some embodiments is provided.

Referring now to FIG. 4G, the attachment of a surface mount processor module 210 according to some embodiments is provided. In this figures, the view of the assembly has been flipped top to bottom.

Thus, and according to some embodiments, it can be seen that a completed (packaged) SIP service module may have connections on both exposed surfaces of the packaged device; that is, it has external connectors of one surface for connections to a custom SIP 210 device and a ball grid array 340 on the other surface for connections with external circuits or systems. According to some embodiments, in order to test a SIP service module, both sets of connections should be exercised as part of the testing process.

Figure 4H:
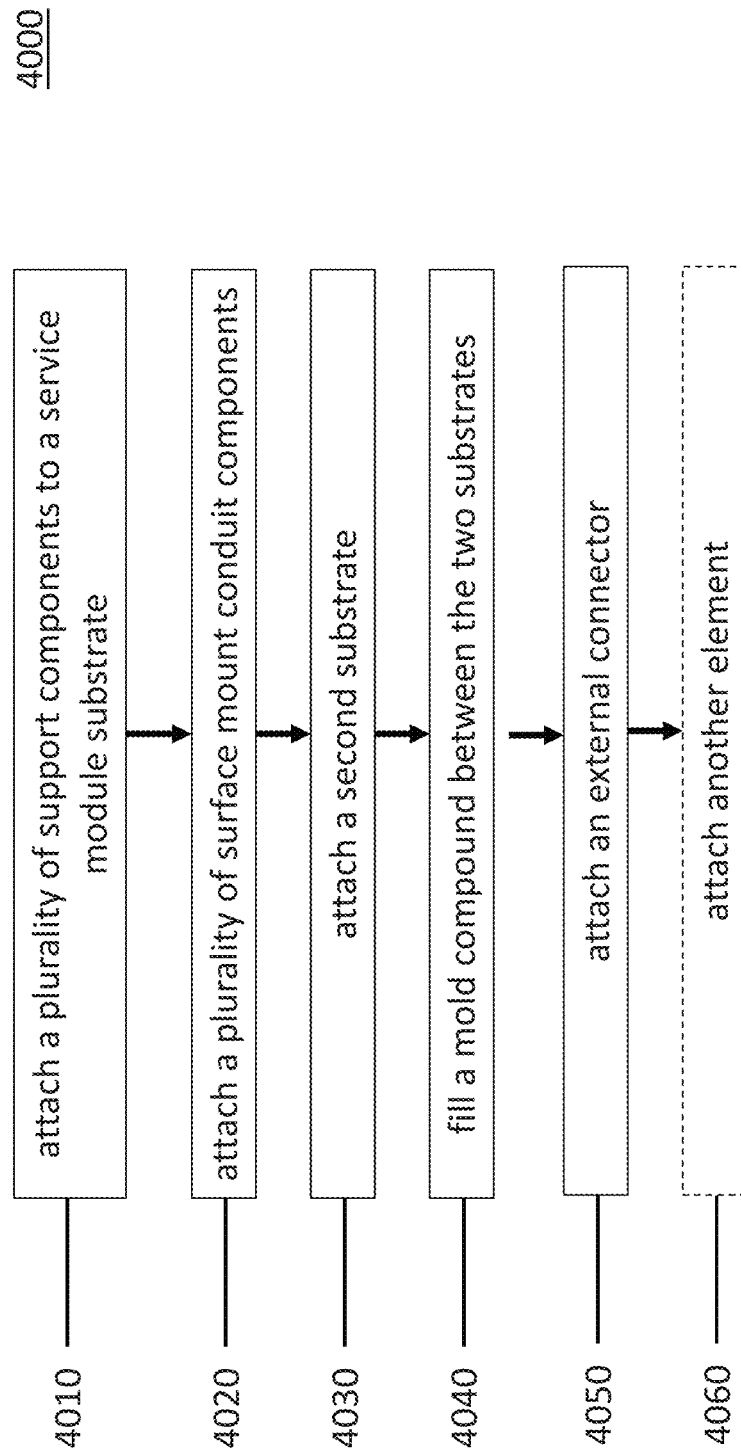
FIG. 4H is a flow chart of a process according to some embodiments.

Referring now to FIG. 4H, FIG. 4H is a flow chart of process 4000 according to aspects of the foregoing embodiments illustrated in FIGS. 4A-4G. The process 4000 may begin, for instance, at step 4010 with the attachment of a plurality of support components to a service module substrate. For instance, this step may include attachment as set forth with respect to FIGS. 4A and 4B. In step 4020, a plurality of surface mount conduit components are attached, for instance, as illustrated in FIG. 4C. In step 4030, a second substrate is attached, for instance, as illustrated with respect to FIG. 4D. In step 4040, a molding compound is filled between the two substrate, for instance, as illustrated with respect to FIG. 4E. In step 4050, one or more external connector and another surface mount element (optionally), such as a processor, is attached, for instance, as illustrated with respect to FIGS. 4F and 4G, respectively.

According to some embodiments, the testing process uses automated test equipment (ATE) for such SIP service module testing after packaging is completed. However, the need to test the connectors on both sides of a SIP service module may impose some unique test arrangements and conditions.

Figure 5:
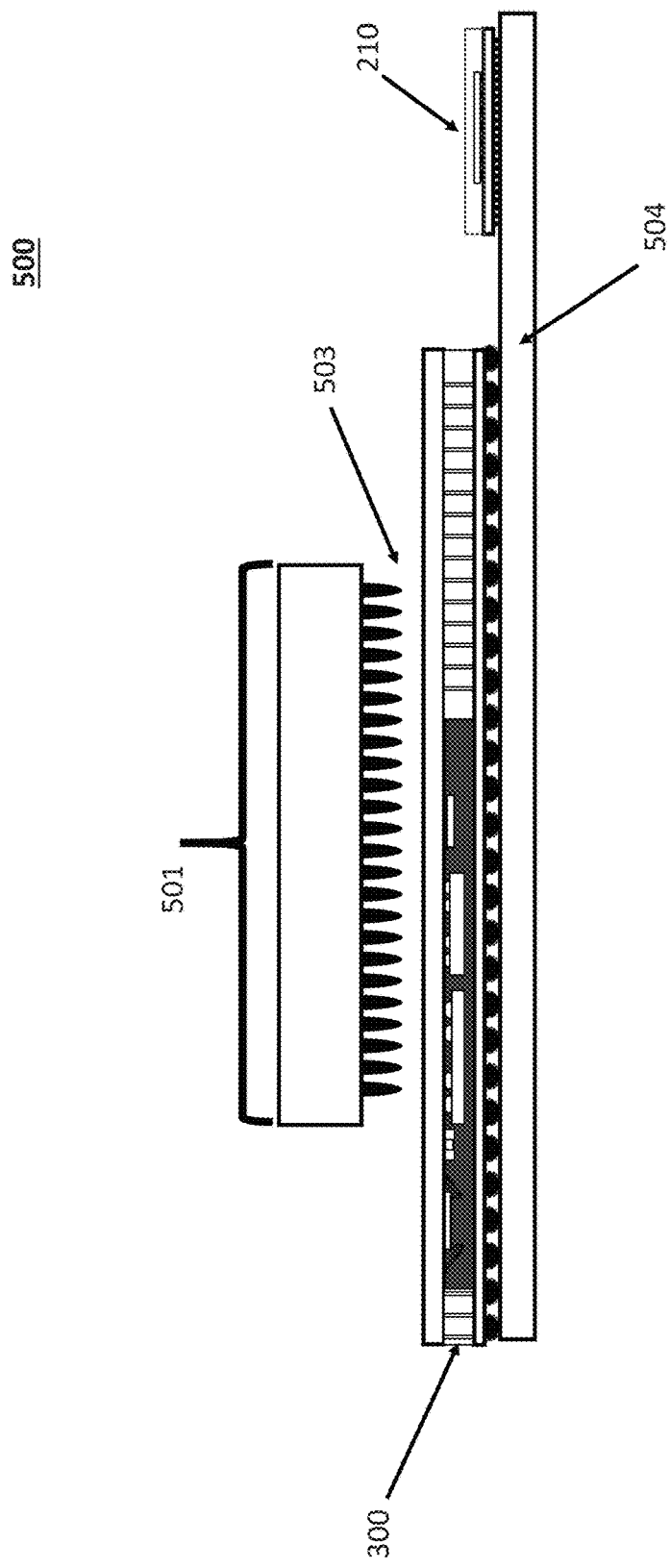
FIG. 5 depicts a block diagram for testing the service module according to some embodiments.

FIG. 5 depicts a block diagram of equipment that may be used with an ATE for a method of testing a service module according to some embodiments. For instance, a method for testing a SIP service module using an ATE may comprise providing a proxy test head 501 connected to a SIP module 210, placing the SIP service module 300 in a test socket on a test/load board 504, then using the proxy test head 501, which has the same pattern and layout of contacts 503 as the contacts on a second custom SIP module 210 to make the connections of the second module 210 with the service module 300, and using the test head 501 and the test board 504 in conjunction with the ATE to test the service module 300 as the device under test (DUT). The ATE is not depicted in FIG. 5; however, the load board 504 may be located on and interconnected with the ATE (or on a handler collocated and attached to the ATE). Similarly, and according to some embodiments, the proxy test head 501 can be operatively interconnected to the ATE and configured to mate with the contacts on the service module where the custom SIP would normally be positioned and connected to the service module.

According to some embodiments, a custom SIP module 210 is depicted in FIG. 5 as also being positioned on the load board 504 in a separate test socket, and this allows for testing of both the service module 300 and its intended custom SIP 210 by the ATE at the same time. For instance, this can allow for testing of the two SIP components needed for a complete system. These may be the actual two components to be connected to create the desired system, or the SIP 210 may one that is repeatedly used to test each of the service modules 300 that need to be tested. Similarly, the service module may be fixed and used to repeatedly test each of the custom SIP devices that need to be tested.

Although a custom SIP module 210 is depicted in FIG. 5 as being positioned on the load board 504, it may be replaced by a suitable test controller that is fixed on the load board for the testing of each of the service modules 300 that need to be tested in alternative embodiments. A similar test controller replacement may be made for the testing of each of the custom SIP devices that need to be tested. The test controller may be a processor, programmable logic array, or a memory containing the desired test vectors and any state machine needed by the ATE.

ATE testing of a device may be accomplished by sequentially sending test vectors using a plurality of connections (e.g., scan chains) and other connections/pins (input/output connections) to the device under test (DUT) 300 (e.g. the service module) mounted in a load board 504 attached to and operatively connected to the ATE. The test vectors may be processed by the DUT 300 and the resulting output vectors may be returned to the ATE using the same connections. The ATE may determine whether the DUT 300 is good or faulty after all of the test vectors have been run by the DUT. In some instances, when the ATE determines that the DUT 300 is faulty due to a failed test, the testing of the DUT is stopped and a new DUT 300 is loaded for testing. In other instances, the testing may continue for the DUT with the failed test recorded and/or noted. According to some embodiments, the ATE makes a determination regarding a failed test by comparing actual test results from the DUT with expected test results. The test vectors used for such actual tests are a series of signals that are applied to the DUT inputs and/or special test inputs. The test vectors may be digital or analogue. In some cases, further information may be generated by the ATE to describe the various reasons why the DUT failed a test. According to some embodiment, the disclosed service module may be used with the ATE devices and process as set forth in PCT/US2018/016171 ("Automated Test Equipment Method for Testing System in a Package Devices"), filed Jan. 31, 2018, which claims the priority to U.S. provisional Application No. 62/452,606 filed on Jan. 31, 2017, the disclosures of which are incorporated herein by reference in their entirety. For instance, in FIG. 11 of PCT/US2018/016171, the ATE 1101 communicates with the DUT 1104 via 1102 and independently with the memory device 1106 via 1107. Further, in FIG. 12 of PCT/US2018/016171, passives 1204, 1209, 1210 and 1212 are included in the DUT along with multiple die 1205, 1211, and 1213. Referring to FIG. 13 of PCT/US2018/016171, multiple DUTs 1306 are tested in parallel with a controller assigned to each 1304.

In certain aspects, Built-in-Self-Test (BIST) circuitry may be integrated into the service components of a DUT 300. Such BIST circuitry may be used to run test patterns within the DUT 300 and inter-subsystem. Utilizing BIST effectively can allow access to subsystems otherwise not accessible from external pins and reduces the workload of the ATE. When BIST is used, the ATE connects to and drives the inputs (e.g., test input vectors) to the BIST circuitry and collects the output data (e.g., test output vectors) from the BIST circuitry. According to some embodiments, the input vectors are designed to uncover specific anticipated faults in the DUT. Input vectors may be generated using a process called ATPG (automatic test pattern generation) based on the design of SIP.

Figure 6:
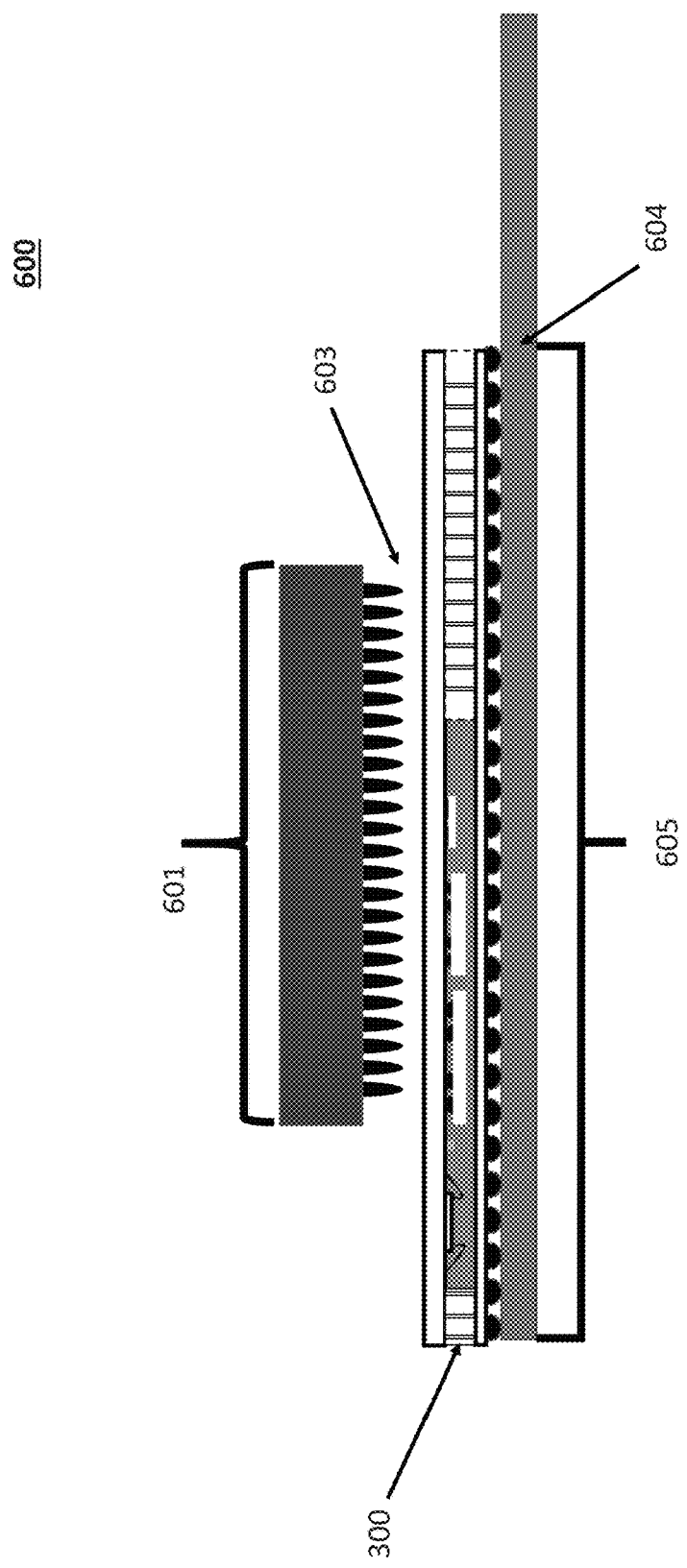
FIG. 6 depicts a block diagram for testing the service module according to some embodiments.

FIG. 6 is a block diagram for testing a service module according to some embodiments. This arrangement provides, for instance, a method to test the service module 300 of a partitioned two-module system by providing (e.g., through the test head 601) the needed signals similar to, but not the same as the custom SIP module 210 by utilizing the test systems internal test signals. The ATE (automated test equipment) is provided with a set of contactors that match the top side contacts 603 of module 300. The ATE also connects to the balls of the service module 300 using a load board 604. Once connected the ATE tests the service module 300 using the load board port 605 and the test head port 601.

FIGS. 7A and 7B are block diagrams for testing a service module 300 according to some embodiments. This arrangement provides another method to test the service module, and in this example, the service module is tested twice. The first time the ATE is connected to the top 205 of the module 300, and the ATE then tests a portion of the module 300 (using the external connectors where the custom SIP 210 would normally be connected) through the port 705 of the load board 701 (step 1). The service module is then flipped over, and a second test is then performed on the module 300 through the ball grid array 340 (step 2). The connection to the ATE is through the port 755 on the load board 751. In this example, it is assumed there are two different load boards 701 and 751. But the two ports 705 and 755 may also be part of the same load board such that two DUTs could be tested simultaneously, one using port 705 and one using port 755 in alternative embodiments.

According to some embodiments, for instance, in connection with one or more of FIGS. 5-7B, a load board and handler can test more than one device at a time, which means there could be more than one device tested at a time. In certain aspects, in the case of two devices being tested using the different ports, a tester could do four (two each) or more.

According to some embodiments, a method to test one part (e.g., 300) of a partitioned 2-module system is disclosed, for instance, by providing a proxy test head (e.g., 601) of the second module (e.g., 210) by permanently placing the second module (e.g., 210) on the test board (e.g. 604) and using a proxy test head (e.g., 601) that has matching contacts (e.g., 603) as the contacts on second module (e.g., 210) to mimic the connection of the second module (e.g., 210) with the first module (e.g., 300). In some embodiments, the test head (e.g., 601) and the test board (e.g., 604) are used in conjunction with an automated test system.

According to some embodiments, a method to test one part (e.g. 300) of a partitioned 2-module system by providing through the test head (e.g., 601) the needed signals similar to but not the same as a second module (e.g. 210) by utilizing the test systems internal test signals. In this example, the ATE is provided with a set of contactors that match the top side (e.g., 603) of a module (e.g., 300).

According to some embodiments, the contact locations on the top surface are the same as the ball locations on the bottom surface, so the module may be tested right side up or upside down.

According to some embodiments, testing a service module in one socket on a load board and the custom SIP in a different smaller socket on that same load board are provided.

According to some embodiments, processes 8000-14000 are provided in FIGS. 8-14. Such processes may use one or more service modules as described herein.

Figure 8:
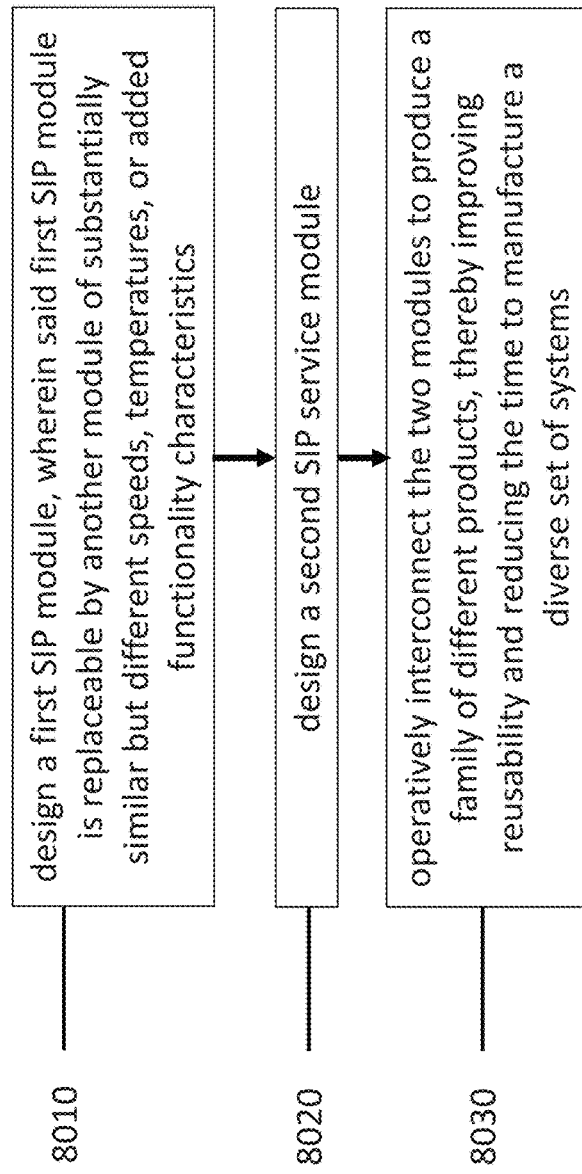
FIG. 8 depicts a flow chart of a process according to some embodiments.

As shown in FIG. 8, there is provided a process 8000 according to some embodiments. The process 8000 may begin, for instance, at step 8010 with designing a first SIP module, wherein said first SIP module is replaceable by another module of substantially similar but different speeds, temperatures, or added functionality characteristics. In step 8020, a second SIP module is designed. In step 8030, the first and second SIP modules are operatively interconnected to produce a family of different products, thereby improving reusability and reducing the time to manufacture a diverse set of systems.

Figure 9:
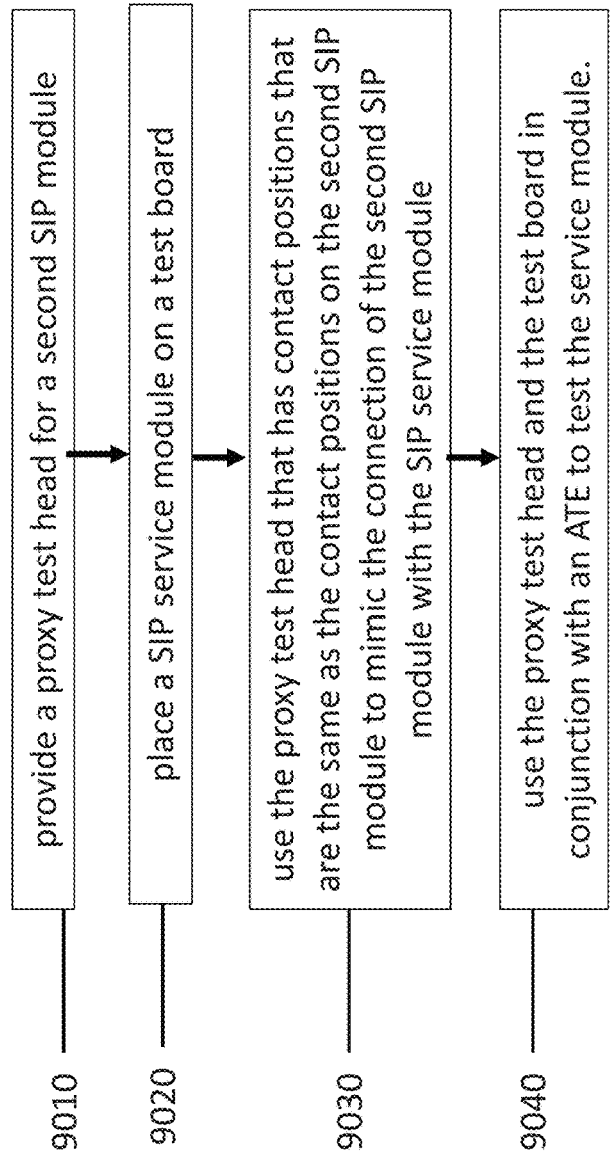
FIG. 9 depicts a flow chart of a process according to some embodiments.

As shown in FIG. 9, there is provided a process 9000 according to some embodiments. The process 9000 may begin, for instance, at step 9010 with providing a proxy test head for a second SIP module. In step 9020, a SIP service module is placed on a test board. In step 9030, the proxy test head that has contact positions that are the same as the contact positions on the second SIP module is used to mimic the connection of the second SIP module with the SIP service module. In step 9040, the proxy test head and the test board are used in conjunction with an ATE to test the service module.

Figure 10:
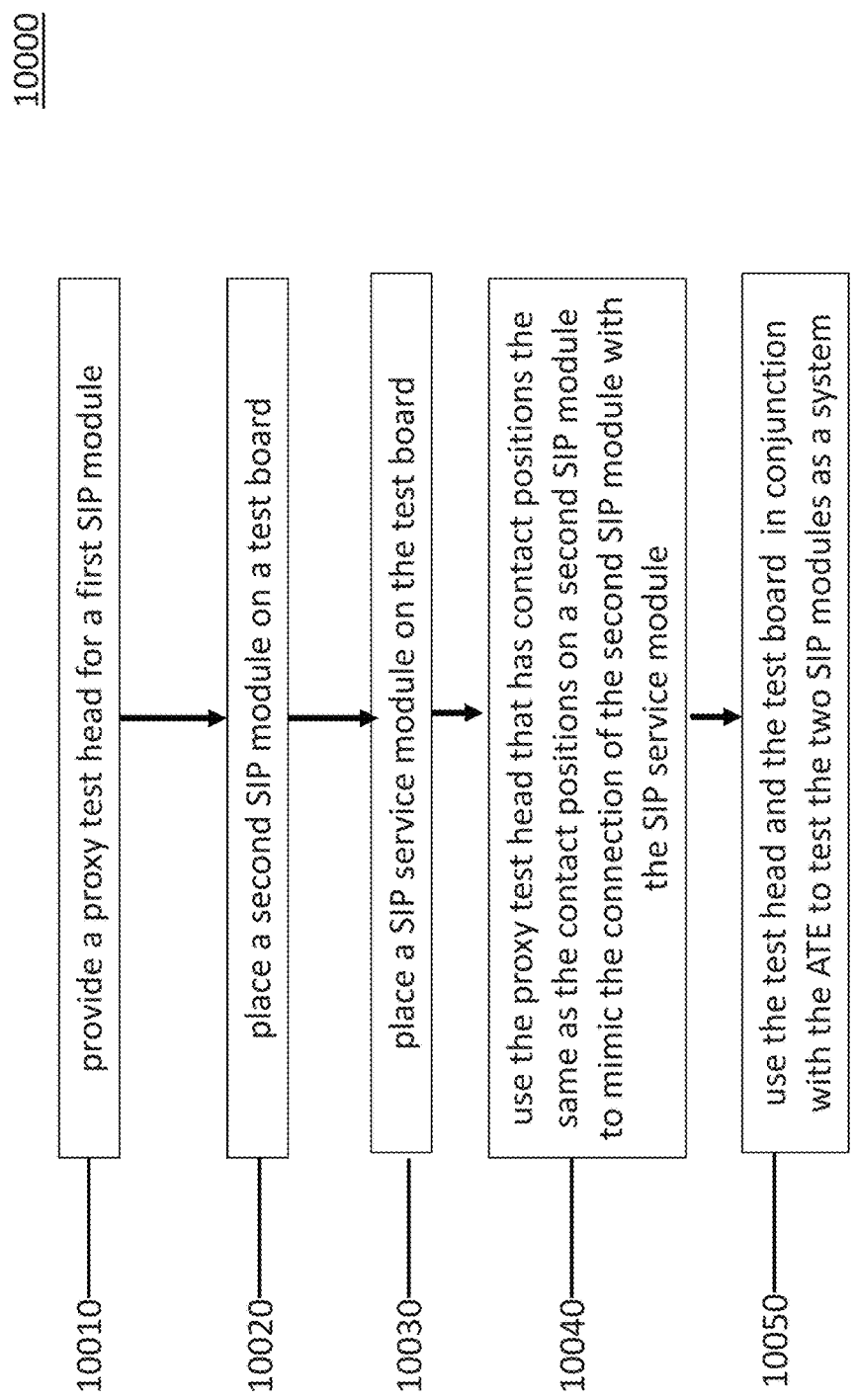
FIG. 10 depicts a flow chart of a process according to some embodiments.

As shown in FIG. 10, there is provided a process 10000 according to some embodiments. The process 10000 may begin, for instance, at step 10010 with providing a proxy test head for a first SIP module. In step 10020, a second SIP module is placed on a test board. In step 10030, a SIP service module is placed on the test board. In step 10040, the proxy test head that has the contact positions that are the same as the contact positions on the second SIP module is used to mimic the connection of the second SIP module with the SIP service module. In step 10050, the test head and the test board are used in conjunction with the ATE to test the first and second SIP modules as a system.

Figure 11:
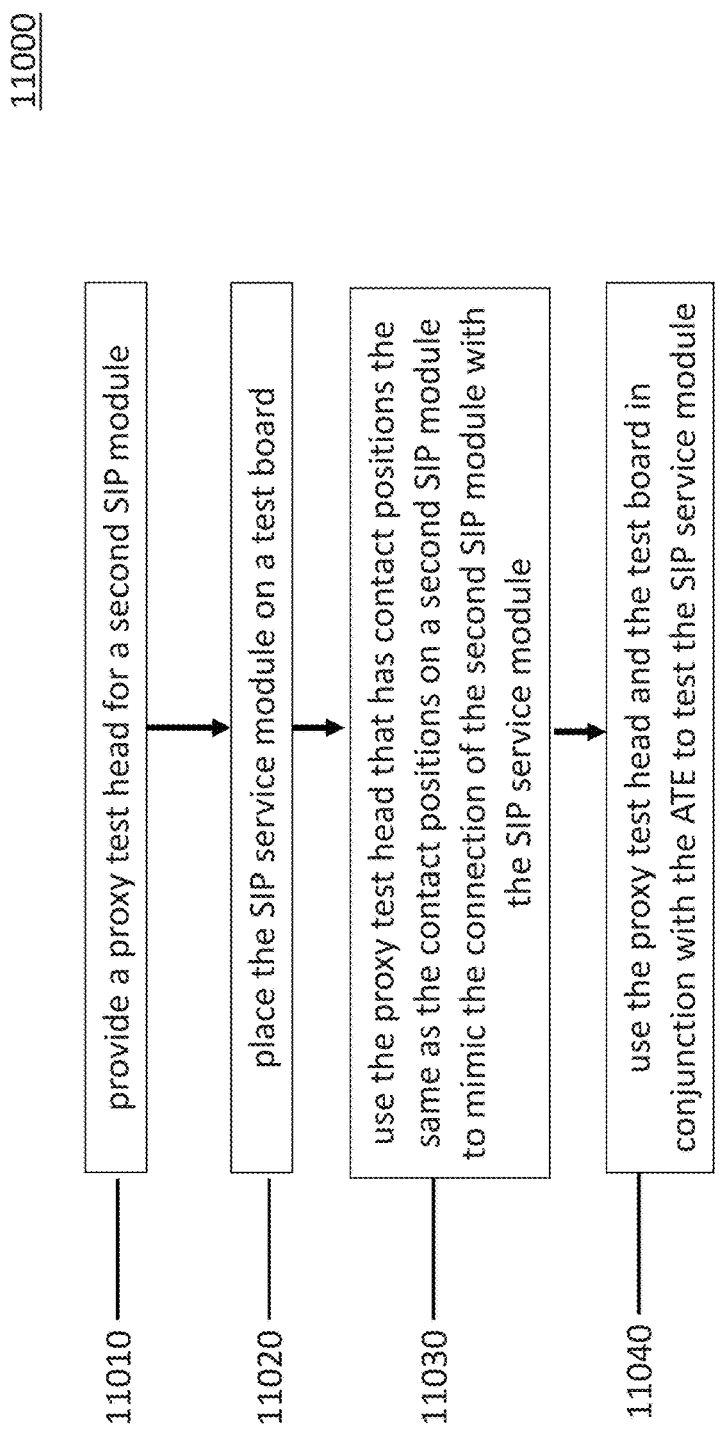
FIG. 11 depicts a flow chart of a process according to some embodiments.

As shown in FIG. 11, there is provided a process 11000 according to some embodiments. The process 11000 may begin, for instance, at step 11010 with providing a proxy test head for a second SIP module. In step 11020, a SIP service module is placed on a test board. In step 11030, the proxy test head that has contact positions that are the same as the contact positions on the second SIP module is used to mimic the connection of the second SIP module with the SIP service module. In step 11040, the proxy test head and the test board are used in conjunction with the ATE to test the SIP service module.

Figure 12:
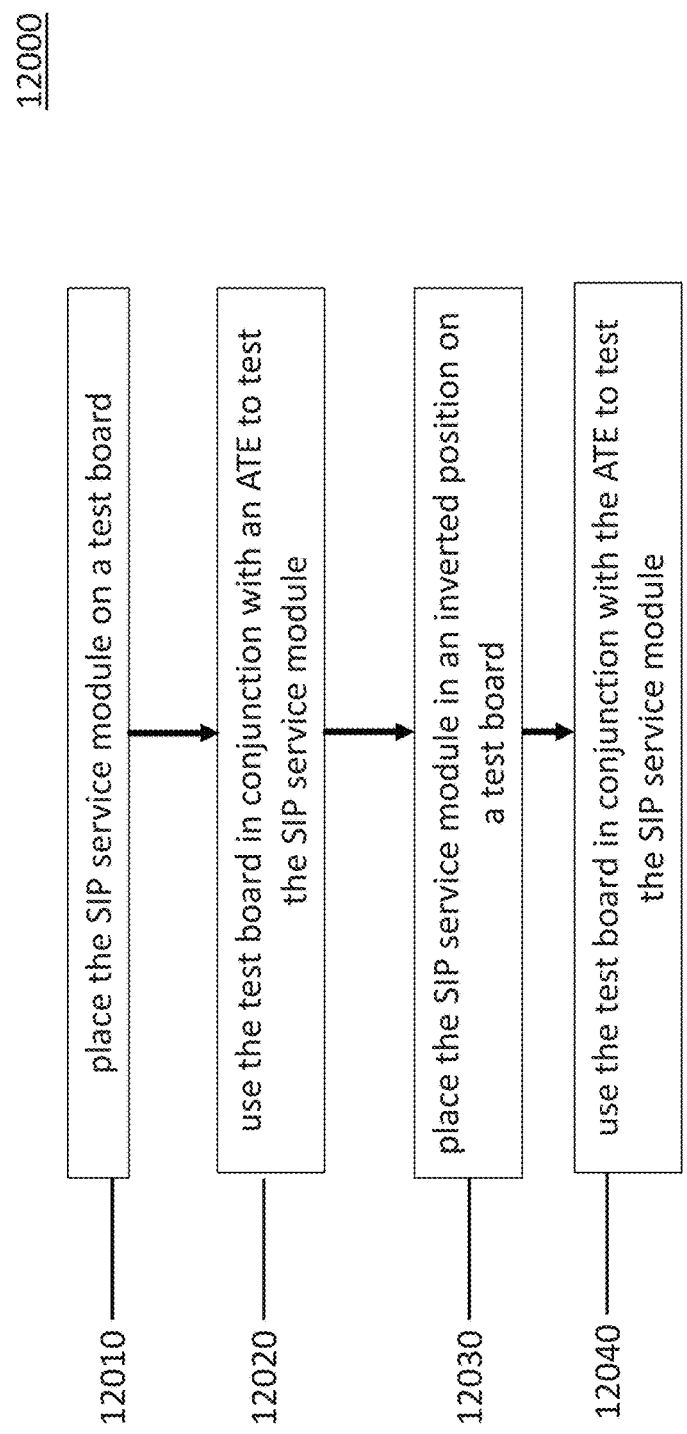
FIG. 12 depicts a flow chart of a process according to some embodiments.
Figure 13:
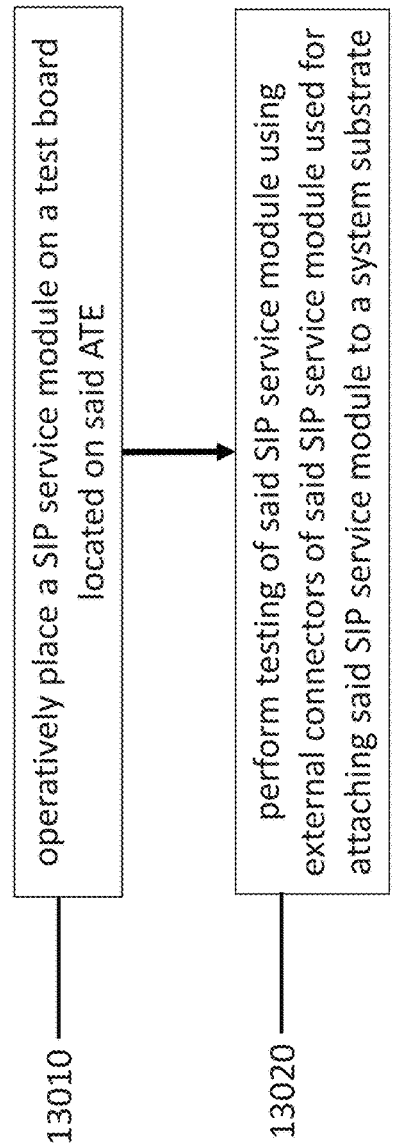
FIG. 13 depicts a flow chart of a process according to some embodiments.

As shown in FIG. 12, there is provided a process 12000 according to some embodiments. The process 12000 may begin, for instance, at step 12010 with placing a SIP service module on a test board. In step 12020, the test board is used in conjunction with an ATE to test the SIP service module. In step 12030, the SIP service module is placed in an inverted position on the test board. In step 12040, the test board is used in conjunction with the ATE to test the SIP service module.

As shown in FIG. 13, there is provided a process 13000 according to some embodiments. The process 13000 may begin, for instance, at step 13010 with operatively placing a SIP service module on a test board located on said ATE. At step 13020, a test of said SIP service module is performed using external connectors of said SIP service module used for attaching said SIP service module to a system substrate.

In some embodiment, the process 13000 further includes using a proxy test head interconnected with said ATE and connected to external connectors of said SIP service module used for attaching said SIP service module to a SIP device; and performing testing of said SIP service module using external connectors of said SIP service module used for attaching said SIP service module to the system substrate, and said proxy test head for said SIP device.

In some embodiment, the process 13000 further includes placing said SIP device on said load board and operatively connecting said SIP device to said ATE; and performing testing of said SIP service module using external connectors of said SIP service module used for attaching said SIP service module to the system substrate, and said proxy test head for said SIP device.

In some embodiment, the process 13000 further includes operatively placing the SIP service module on the test board located on said ATE in an inverted position from said first testing; and performing a second testing of said SIP service module using external connectors of said SIP service module used for attaching said SIP service module to the system substrate.

In some embodiments, said SIP service module comprises a first substrate and a second substrate, wherein said first substrate comprises a first plurality of external connectors on an exposed surface of said first substrate for connecting to an external circuit, and wherein said second substrate comprises a second plurality of external connectors on an exposed surface of said second substrate for connecting to an external device to be connected to and mounted on said second plurality of external connectors, and wherein the arrangement of said external connectors are mirror images of each other.

Figure 14:
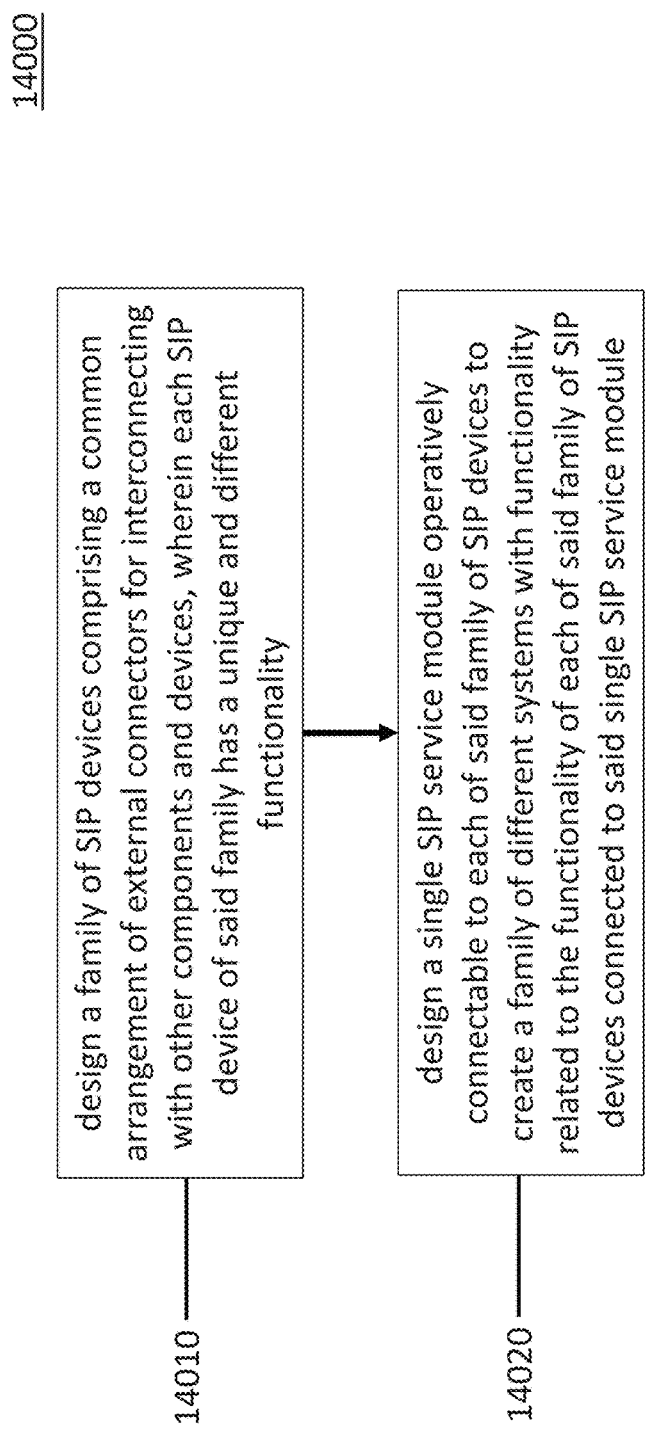
FIG. 14 depicts a flow chart of a process according to some embodiments.

As shown in FIG. 14, there is provided a process 14000 according to some embodiments. The process 14000 may begin, for instance, at step 14010 with designing a family of SIP devices comprising a common arrangement of external connectors for interconnecting with other components and devices, wherein each SIP device of said family has a unique and different functionality. In step 14020, a single SIP service module is designed which is operatively connectable to each of said family of SIP devices to create a family of different systems with functionality related to the functionality of each of said family of SIP devices connected to said single SIP service module.

In some embodiments, the SIP service module comprises a first substrate with a first surface and a second surface, the first substrate comprising a first plurality of surface mount active devices, a first plurality of passive components, and a first plurality of surface mount conduits mounted on one surface of said first substrate; a second substrate mounted on and attached to said first plurality of surface mount conduits to create an enclosed space between interior surfaces of said first and second substrates and leaving an exposed surface for each of said first and second substrates; a first plurality of external connectors on said exposed surface of said second substrate for connecting to an external circuit; and a second plurality of external connectors on said exposed surface of said first substrate for connecting to an external device or component to be connected to and mounted on said second plurality of external connectors.

EXEMPLARY EMBODIMENTS

Aspects of the disclosure are summarized by the following numbered embodiments.

Embodiment 1

A service module for a SIP device, comprising:
a first substrate with a plurality of active and passive components mounted on a surface of said first substrate and a plurality of conduits;
a second substrate attached to one or more of said plurality of conduits;
a molding compound/encapsulant in a space between said first and second substrates;
one or more connectors (such as ball grid array balls, or bumps, or pins) on a non-molded surface of said second substrate for connecting to an external circuit; and
one or more external connectors on the non-molded surface of said first substrate for connecting to an external component to be connected to and mounted on said connectors.

Embodiment 2

The service module of embodiment 1, wherein said active and passive components comprise service components.

Embodiment 3

A SIP device, comprising:
a first substrate on which there are mounted a plurality of active and passive components on a surface of said first substrate and a plurality of conduits;
a second substrate attached to said plurality of conduits;
mold compound filling in the spaces between the two substrates;

a series of connectors on a non-molded surface of said second substrate for connecting to an external circuit;
a series of external connectors on a non-molded surface of said first substrate for connecting to an external component to be connected to and mounted on said connectors, and
a processor and at least one high speed memory mounted on a third substrate connected to and mounted on said series of external connectors.

Embodiment 4

A method for designing a SIP system as a 2-module system, comprising;
designing a first SIP module, wherein said first module is replaceable by a second SIP module of substantially similar but different speeds, temperatures, or added functionality characteristics;
designing a SIP service module; and
operatively interconnecting said first SIP module and said SIP service module to produce a family of different products, thereby improving reusability and reducing the time to manufacture a diverse set of systems.

Embodiment 5

The method of embodiment 4, wherein said second SIP module is in the same family as said first SIP module.

Embodiment 6

A method for testing a SIP service module using an ATE, comprising:
providing a proxy test head (501) for a second SIP module (210);
placing the SIP service module (300) on a test board (504);
using the proxy test head (501) that has contact positions (503) the same as the contact positions on a second SIP module (210) to mimic the connection of the second module (210) with the service module (300); and
using the test head (501) and the test board (504) in conjunction with the ATE to test the service module.

Embodiment 7

A method for testing a SIP system, comprising two SIP modules, using an ATE, comprising:
providing a proxy test head (501) for a first SIP module;
placing a second SIP module (300) on a test board (504);
placing a SIP module on the test board (504);
using the proxy test head (501) that has contact positions (503) the same as the contact positions on a second SIP module to mimic the connection of the second module with the service module (300), and
using the test head (501) and the test board (504) in conjunction with the ATE to test the two SIP modules as a system.

Embodiment 8

A method for testing a SIP service module using an ATE, comprising:
providing a proxy test head (601) for a second SIP module (210);
placing the SIP service module (300) on a test board (604);
using the proxy test head (601) that has contact positions (603) the same as the contact positions on a second SIP module to mimic the connection of the second module with the service module (300); and
using the test head (601) and the test board (604) in conjunction with the ATE to test the service module.

Embodiment 9

A method for testing a SIP service module using an ATE, comprising:
placing the SIP service module (300) on a test board (701);
using the test board (701) in conjunction with the ATE to test the service module;
placing the SIP service module (300) in an inverted position on a test board (751); and
using the test board (751) in conjunction with the ATE to test the service module.

Embodiment 10

A system comprising:
a base;
a SIP service module, wherein a bottom surface of said SIP service module is mounted on a top surface of said base; and
one or more processors; wherein said one or more processors are mounted on a top surface of said SIP service module.

Embodiment 11

The system of embodiment 10, wherein said base is a Printed Circuit Board (PCB) and at least one of said one or more processors is a microprocessor, controller, FPGA (Field Programmable Gate Array), or GPU (Graphics Processing Unit).

While the present disclosure has been described with respect to the embodiments set forth above, the present disclosure is not limited to these embodiments. Accordingly, other embodiments, variations, and improvements not described herein are not excluded from the scope of the present disclosure. Such variations comprise but are not limited to new substrate material, different kinds of devices attached to the substrate not discussed, or new packaging concepts.

The invention claimed is:
1. A System in a Package (SIP) service module for a SIP based system, comprising:
a first substrate with a top surface and a bottom surface, wherein a first plurality of surface mount active devices, a first plurality of passive components, and a first plurality of surface mount conduits are mounted on the top surface of the first substrate;
a second substrate with a top surface and a bottom surface mounted on and attached to said first plurality of surface mount conduits to create an enclosed space between the first and second substrates, wherein the top surface of the first substrate faces the bottom surface of the second substrate, and wherein the bottom surface of the first substrate and the top surface of the second substrate remain exposed;
a first plurality of external connectors on the top surface of the second substrate for connecting to an external circuit;

a second plurality of external connectors on the bottom surface of the first substrate for connecting to an external device or component to be connected to and mounted on said second plurality of external connectors; and a third substrate comprising a plurality of layers with etched conductors and vias for operatively connecting components mounted thereon, wherein the third substrate is operatively interconnected with said second plurality of external connectors on said first substrate.

2. The SIP service module of claim 1, further comprising:
a mold or encapsulant compound filling in said enclosed space between said first substrate and said second substrate.

3. The SIP service module of claim 1, further comprising:
a second plurality of surface mount active devices and a second plurality of passive components operatively mounted on the bottom surface of the second substrate.

4. The SIP service module of claim 1, wherein said first plurality of external connectors on the top surface of the second substrate comprise at least one or more of ball grid array balls, bumps, and pins.

5. The SIP service module of claim 1, wherein each substrate further comprises a plurality of layers with etched conductors and vias for operatively connecting said surface mount active devices, said passive components, and said external connectors.

6. The SIP service module of claim 1, wherein said surface mount active devices and said passive components comprise service components.

7. The SIP service module of claim 6, wherein said service components comprise at least one or more of DDR3, DDR4, LPDDR4 DRAMs, eMMC flash memory, QSPI flash memory, Ethernet PHY, power management IC (PMIC), LDO regulator, passive components, conduits for pass-through signals, TPM, wireless module, and special purpose components.

8. The SIP service module of claim 1, wherein said components mounted on said third substrate comprise at least one processor and high speed memory.

9. The SIP service module of claim 8, wherein said third substrate comprises a SIP.

* * * * *